US008871555B2

(12) United States Patent
Yamazaki

(10) Patent No.: US 8,871,555 B2
(45) Date of Patent: *Oct. 28, 2014

(54) PHOTOELECTRIC CONVERSION DEVICE AND MANUFACTURING METHOD THEREOF

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 486 days.

This patent is subject to a terminal disclaimer.

(21) Appl. No.: 13/157,570

(22) Filed: Jun. 10, 2011

(65) Prior Publication Data

US 2011/0308586 A1 Dec. 22, 2011

(30) Foreign Application Priority Data

Jun. 18, 2010 (JP) ................. 2010-139993

(51) Int. Cl.
| H01L 21/00 | (2006.01) |
| H01L 31/0376 | (2006.01) |
| H01L 31/0352 | (2006.01) |
| H01L 31/20 | (2006.01) |
| H01L 31/076 | (2012.01) |
| H01L 31/028 | (2006.01) |
| H01L 31/0236 | (2006.01) |
| H01L 31/075 | (2012.01) |
| H01L 31/18 | (2006.01) |
| H01L 31/0368 | (2006.01) |

(52) U.S. Cl.
CPC ........ *H01L 31/028* (2013.01); *H01L 31/03762* (2013.01); *Y02E 10/52* (2013.01); *H01L 31/035281* (2013.01); *H01L 31/202* (2013.01); *H01L 31/076* (2013.01); *Y02E 10/547* (2013.01); *Y02E 10/548* (2013.01); *H01L 31/0236* (2013.01); *Y02E 10/546* (2013.01); *H01L 31/075* (2013.01); *H01L 31/1804* (2013.01); *H01L 31/03682* (2013.01)
USPC ........................................... 438/71; 438/478

(58) Field of Classification Search
CPC ........................... Y02E 10/50; H01L 31/0236
USPC ............. 438/57, 71, 73, 74, 478; 257/E31.13
See application file for complete search history.

(56) References Cited

U.S. PATENT DOCUMENTS

| 4,099,986 A | 7/1978 | Diepers |
| 4,155,781 A | 5/1979 | Diepers |

(Continued)

FOREIGN PATENT DOCUMENTS

| CN | 1147156 A | 4/1997 |
| CN | 101151736 A | 3/2008 |

(Continued)

OTHER PUBLICATIONS

Thomas E. Felter et al.; "Cathodoluminescent Field Emission Flat Panel Display Prototype Built Using Arrays of Diamond-Coated Silicon Tips"; SID Symposium Digest of Technical Papers; May 1998; pp. 577-581; vol. 29.

(Continued)

*Primary Examiner* — Jack Chen
(74) *Attorney, Agent, or Firm* — Fish & Richardson P.C.

(57) ABSTRACT

A photoelectric conversion device having a new anti-reflection structure is provided. A photoelectric conversion device includes a first-conductivity-type crystalline semiconductor region that is provided over a conductive layer; a crystalline semiconductor region that is provided over the first-conductivity-type crystalline semiconductor region and has an uneven surface by including a plurality of whiskers including a crystalline semiconductor; and a second-conductivity-type crystalline semiconductor region that covers the uneven surface of the crystalline semiconductor region having the uneven surface, the second conductivity type being opposite to the first conductivity type. In the photoelectric conversion device, a concentration gradient of an impurity element imparting the first conductivity type is formed from the first-conductivity-type crystalline semiconductor region toward the crystalline semiconductor region having the uneven surface.

10 Claims, 9 Drawing Sheets

(56) References Cited

U.S. PATENT DOCUMENTS

| | | |
|---|---|---|
| 6,518,494 B1 | 2/2003 | Shibuya et al. |
| 6,825,408 B2 | 11/2004 | Nagano et al. |
| 7,396,409 B2 | 7/2008 | Hatta et al. |
| 2003/0106581 A1 | 6/2003 | Shibuya et al. |
| 2005/0126627 A1 | 6/2005 | Hayashida |
| 2008/0251122 A1 | 10/2008 | Ready |
| 2009/0209059 A1 | 8/2009 | Isaka et al. |
| 2011/0266654 A1 | 11/2011 | Kuriki et al. |
| 2011/0292564 A1 | 12/2011 | Yamazaki |
| 2011/0308582 A1 | 12/2011 | Kataishi et al. |
| 2011/0308587 A1* | 12/2011 | Yamazaki ............... 136/255 |
| 2011/0308589 A1 | 12/2011 | Kataishi et al. |
| 2011/0308591 A1 | 12/2011 | Yamazaki et al. |
| 2011/0308600 A1 | 12/2011 | Yamazaki |
| 2011/0312121 A1* | 12/2011 | Yamazaki ............... 438/71 |

FOREIGN PATENT DOCUMENTS

| | | |
|---|---|---|
| JP | 53031987 A | 3/1978 |
| JP | 3151672 A | 6/1991 |
| JP | 9118511 A | 5/1997 |
| JP | 2001210315 A | 8/2001 |
| JP | 2003-258285 A | 9/2003 |
| JP | 2003258285 A | 9/2003 |
| JP | 2005252210 A | 9/2005 |
| JP | 2008532321 A | 8/2008 |
| KR | 2007119656 A | 12/2007 |
| WO | 2007040594 A2 | 4/2007 |

OTHER PUBLICATIONS

L. Gangloff et al.; "Self-Aligned, Gated Arrays of Individual Nanotube and Nanowire Emitters"; Nano Letters; 2004; pp. 1575-1579; vol. 4, No. 9.

Ing-Chi Leu et al.; "Chemical Vapor Deposition of Silicon Carbide Whiskers Activated by Elemental Nickel"; Journal of the Electrochemical Society; 1999; pp. 184-188; vol. 146, No. 1.

A.J. Pedraza et al; "Silicon microcolumn arrays grown by nanosecond pulsed-excimer laser irradiation"; Applied Physics Letters; 1999; pp. 2322-2324; vol. 74, No. 16.

Strausse,Y. et al., "Characterization of the low-pressure chemical vapor deposition grown rugged polysilicon surface using atomic force microscopy," J. Vac. Sci. Technol. (Journal of Vacuum Science & Technology), May 1, 1997, vol. A15, No. 3, pp. 1007-1013, in English.

International Search Report (Application No. PCT/JP2011/063190) Dated Sep. 20, 2011, in English.

Written Opinion (Application No. PCT/JP2011/083190) Dated Sep. 20, 2011, in English.

Strausse,Y. et al., "Characterization of the low-pressure chemical vapor deposition grown rugged polysilicon surface using atomic force microscopy," J. Vac. Sci. Technol. A (Journal of Vacuum Science & Technology A), May 1, 1997, vol. 15, No. 3, pp. 1007-1013, in English.

* cited by examiner 111
109
108 region 109 side

↓ low

↓ high region 108 side impurity element concentration

PHOTOELECTRIC CONVERSION DEVICE AND MANUFACTURING METHOD THEREOF

TECHNICAL FIELD

The present invention relates to a photoelectric conversion device and a method for manufacturing the same.

BACKGROUND ART

Recently, a photoelectric conversion device, which is a power generation means that generates power without carbon dioxide emissions, has attracted attention as a countermeasure against global warming. A solar cell for supplying residential power or the like, which generates power from sunlight outdoors, is known as a typical example thereof. For such a solar cell, a crystalline silicon solar cell using single crystal silicon or polycrystalline silicon is mainly used.

An uneven structure is provided on a surface of a solar cell using a single crystal silicon substrate or a polycrystalline silicon substrate in order to reduce surface reflection. The uneven structure provided on the surface of the silicon substrate is formed by etching the silicon substrate with an alkaline solution such as an aqueous sodium hydroxide solution. Since the etching rate by the alkaline solution varies depending on a crystal plane orientation of silicon, when a silicon substrate with a (100) plane is used for example, a pyramidal uneven structure is formed.

Although the above uneven structure can reduce surface reflection of the solar cell, the alkaline solution used for etching causes contamination of the silicon substrate. In addition, since etching characteristics considerably vary depending on the concentration or temperature of the alkaline solution, it is difficult to form the uneven structure on the surface of the silicon substrate with high reproducibility. For the difficulty, a combination method of a laser processing technique and chemical etching is disclosed (for example, see Patent Document 1).

On the other hand, in a solar cell whose photoelectric conversion layer is formed using a semiconductor thin film of silicon or the like, it is difficult to form an uneven structure on a surface of the silicon thin film by above etching using an alkaline solution.

REFERENCE

[Patent Document 1] Japanese Published Patent Application No. 2003-258285

DISCLOSURE OF INVENTION

In any case, the method in which the silicon substrate itself is etched to form the uneven structure on the surface of the silicon substrate is not favorable because the method has a problem in controllability of the uneven shape and affects the characteristics of the solar cell. In addition, since the alkaline solution and a large amount of rinse water are needed for etching of the silicon substrate and it is necessary to pay attention to the contamination of the silicon substrate, the method is also not favorable in terms of productivity.

Thus, an object of an embodiment of the present invention is to provide a photoelectric conversion device having a novel anti-reflection structure.

One feature of an embodiment of the present invention is to form an uneven structure on a surface of a semiconductor by crystal growth of the same or different kind of semiconductor instead of forming an anti-reflection structure by etching a surface of a semiconductor substrate or a semiconductor film.

For example, by providing a semiconductor layer including a plurality of protrusions on a light incident plane side of a photoelectric conversion device, surface reflection can be considerably reduced. Such a structure can be formed by a vapor deposition method; therefore, the contamination of the semiconductor is not caused.

By a vapor deposition method, a semiconductor layer including a plurality of whiskers as an uneven structure can be grown, whereby an anti-reflection structure of the photoelectric conversion device can be formed.

One embodiment of the present invention is a photoelectric conversion device including a first-conductivity-type crystalline semiconductor region that is provided over a conductive layer; a crystalline semiconductor region that is provided over the first-conductivity-type crystalline semiconductor region and has an uneven surface by including a plurality of whiskers including a crystalline semiconductor; and a second-conductivity-type crystalline semiconductor region that covers the uneven surface of the crystalline semiconductor region having the uneven surface, the second conductivity type being opposite to the first conductivity type. In the photoelectric conversion device, a concentration gradient of an impurity element imparting the first conductivity type is formed from the first-conductivity-type crystalline semiconductor region toward the crystalline semiconductor region having the uneven surface.

One embodiment of the present invention is a photoelectric conversion device including a first-conductivity-type crystalline semiconductor region, an intrinsic crystalline semiconductor region, and a second-conductivity-type crystalline semiconductor region that are stacked over an electrode. The intrinsic crystalline semiconductor region includes a flat crystalline semiconductor region, and a plurality of whiskers that are provided over the flat crystalline semiconductor region and include a crystalline semiconductor. That is, the intrinsic crystalline semiconductor region includes the plurality of whiskers; thus, a surface of the second-conductivity-type crystalline semiconductor region is uneven. In addition, an interface between the intrinsic crystalline semiconductor region and the second-conductivity-type crystalline semiconductor region is uneven. In the photoelectric conversion device, a concentration gradient of an impurity element imparting the first conductivity type is formed from the first-conductivity-type crystalline semiconductor region toward the intrinsic crystalline semiconductor region.

One embodiment of the present invention is a photoelectric conversion device including a first-conductivity-type crystalline semiconductor region, an intrinsic crystalline semiconductor region, and a second-conductivity-type crystalline semiconductor region that are stacked over an electrode. The first-conductivity-type crystalline semiconductor region includes a flat crystalline semiconductor region including an impurity element imparting the first conductivity type, and a plurality of whiskers that are provided over the flat crystalline semiconductor region and include a crystalline semiconductor including the impurity element imparting the first conductivity type. That is, the first-conductivity-type crystalline semiconductor region includes the plurality of whiskers; thus, a surface of the second-conductivity-type crystalline semiconductor region is uneven. In addition, an interface between the first-conductivity-type crystalline semiconductor region and the intrinsic crystalline semiconductor region is uneven. In the photoelectric conversion device, a concentration gradient of the impurity element imparting the first conductivity type is formed from the first-conductivity-type crystalline semiconductor region toward the intrinsic crystalline semiconductor region.

Note that in the above photoelectric conversion device, the first-conductivity-type crystalline semiconductor region is one of an n-type semiconductor region and a p-type semiconductor region, and the second-conductivity-type crystalline semiconductor region is the other of the n-type semiconductor region and the p-type semiconductor region.

One embodiment of the present invention is a photoelectric conversion device including, in addition to the above structure, a third-conductivity-type semiconductor region, an intrinsic semiconductor region, and a fourth-conductivity-type semiconductor region that are stacked over the second-conductivity-type crystalline semiconductor region. Here, a surface of the second-conductivity-type crystalline semiconductor region is uneven. Note that the band gap of the intrinsic crystalline semiconductor region is different from the band gap of the intrinsic semiconductor region.

Note that in the above photoelectric conversion device, the first-conductivity-type crystalline semiconductor region and the third-conductivity-type semiconductor region are one of an n-type semiconductor region and a p-type semiconductor region, and the second-conductivity-type crystalline semiconductor region and the fourth-conductivity-type semiconductor region are the other of the n-type semiconductor region and the p-type semiconductor region.

Directions of axes of the plurality of whiskers which are provided in the first-conductivity-type crystalline semiconductor region or the intrinsic crystalline semiconductor region may be the direction normal to the electrode. Alternatively, the directions of axes of the plurality of whiskers which are provided in the first-conductivity-type crystalline semiconductor region or the intrinsic crystalline semiconductor region may be varied.

The electrode includes a conductive layer. The conductive layer can be formed using a metal element which forms silicide by reacting with silicon. Alternatively, the conductive layer can be formed with a stacked layer structure including a layer which is formed using a material having high conductivity such as a metal element typified by platinum, aluminum, or copper, and a layer which is formed using a metal element which forms silicide by reacting with silicon.

The electrode may include a mixed layer covering the conductive layer. The mixed layer includes a metal element and silicon. The mixed layer may include silicon and a metal element which is included in the conductive layer. In the case where the conductive layer is formed using a metal element which forms silicide by reacting with silicon, the mixed layer may be formed of silicide.

In the photoelectric conversion device, the first-conductivity-type crystalline semiconductor region or the intrinsic crystalline semiconductor region includes a plurality of whiskers; thus, light reflectance at the surface can be reduced. In addition, since the photoelectric conversion layer absorbs light incident on the photoelectric conversion layer owing to a light-trapping effect, characteristics of the photoelectric conversion device can be improved.

One embodiment of the present invention is a method for manufacturing a photoelectric conversion device, including the steps of forming a first-conductivity-type crystalline semiconductor region by a low pressure chemical vapor deposition method (hereinafter, also referred to as a low pressure CVD method or an LPCVD method) using a deposition gas containing silicon and a gas imparting the first conductivity type as a source gas over a conductive layer; forming an intrinsic crystalline semiconductor region that includes a crystalline semiconductor region and a plurality of whiskers including a crystalline semiconductor by a low pressure CVD method using a deposition gas containing silicon as a source gas over the first-conductivity-type crystalline semiconductor region, and moving an impurity element imparting the first conductivity type from the first-conductivity-type crystalline semiconductor region toward the intrinsic crystalline semiconductor region; and forming a second-conductivity-type crystalline semiconductor region by a low pressure CVD method using a deposition gas containing silicon and a gas imparting the second conductivity type as a source gas over the intrinsic crystalline semiconductor region.

One embodiment of the present invention is a method for manufacturing a photoelectric conversion device, including the steps of forming a first-conductivity-type crystalline semiconductor region that includes a crystalline semiconductor region and a plurality of whiskers including a crystalline semiconductor by a low pressure CVD method using a deposition gas containing silicon and a gas imparting the first conductivity type as a source gas over a conductive layer; forming an intrinsic crystalline semiconductor region by a low pressure CVD method using a deposition gas containing silicon as a source gas over the first-conductivity-type crystalline semiconductor region, and moving an impurity element imparting the first conductivity type from the first-conductivity-type crystalline semiconductor region toward the intrinsic crystalline semiconductor region; and forming a second-conductivity-type crystalline semiconductor region by a low pressure CVD method using a deposition gas containing silicon and a gas imparting the second conductivity type as a source gas over the intrinsic crystalline semiconductor region.

Note that the low pressure CVD method is performed at a temperature higher than 550° C. In addition, silicon hydride, silicon fluoride, or silicon chloride may be used for the deposition gas containing silicon. In addition, the gas imparting the first conductivity type is one of diborane and phosphine, and the gas imparting the second conductivity type is the other of the diborane and the phosphine.

By a low pressure CVD method, the first-conductivity-type crystalline semiconductor region which includes the plurality of whiskers or the intrinsic crystalline semiconductor region which includes the plurality of whiskers can be formed over the conductive layer which is formed using a metal element which forms silicide by reacting with silicon.

Note that in this specification, an "intrinsic semiconductor" refers to not only a so-called intrinsic semiconductor in which the Fermi level lies in the middle of the band gap, but a semiconductor in which the concentration of an impurity imparting p-type or n-type conductivity is $1 \times 10^{20}$ cm$^{-3}$ or lower and photoconductivity is 100 times or more as high as the dark conductivity. This intrinsic semiconductor may include an impurity element belonging to Group 13 or Group 15 of the periodic table. Accordingly, the problems can be solved even with the use of a semiconductor having n-type or p-type conductivity as well as the use of the intrinsic semiconductor, and thus another semiconductor having a similar effect can be used. Such a substantially intrinsic semiconductor is included in an intrinsic semiconductor in this specification.

According to an embodiment of the present invention, the surface of the second-conductivity-type crystalline semiconductor region is uneven, whereby the characteristics of the photoelectric conversion device can be improved. In other words, by providing a group of whiskers for a plane on a light incident side of the intrinsic crystalline semiconductor region, surface reflection can be reduced.

BEST MODE FOR CARRYING OUT THE INVENTION

Figure 1:
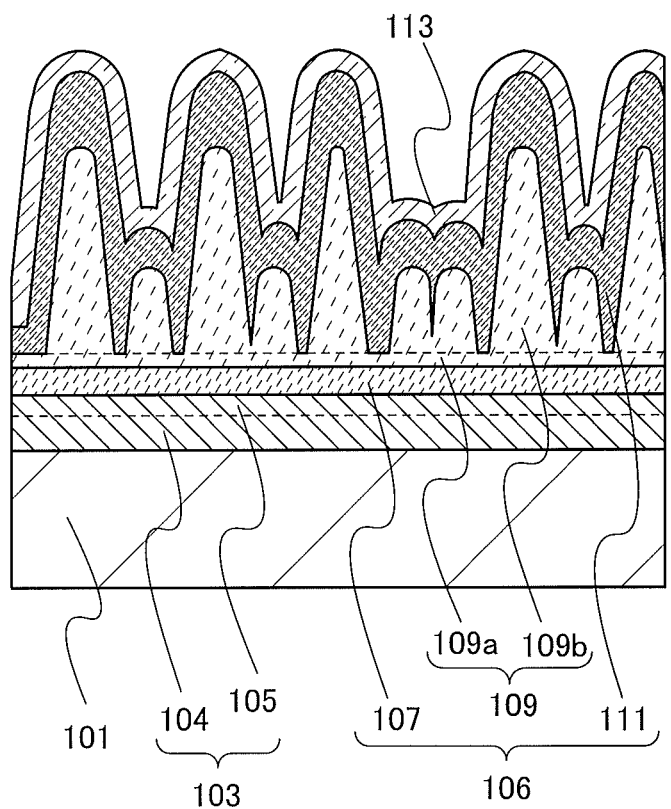
FIG. 1 is a cross-sectional view illustrating a photoelectric conversion device.

Hereinafter, embodiments and an example of the present invention will be described with reference to the drawings. Note that the invention is not limited to the following description, and it will be readily appreciated by those skilled in the art that various changes and modifications can be made without departing from the spirit and scope of the invention. Thus, the present invention should not be construed as being limited to the following description of the embodiments and example. In description with reference to the drawings, in some cases, the same reference numerals are used in common for the same portions in different drawings. Further, in some cases, the same hatching patterns are applied to similar parts, and the similar parts are not necessarily designated by reference numerals.

Note that in each drawing described in this specification, the size, the layer thickness, or the region of each component is exaggerated for clarity in some cases. Therefore, the scale of each structure is not necessarily limited to that illustrated in the drawings.

Note that terms such as first, second, and third in this specification are used in order to avoid confusion among components, and the terms do not limit the components numerically. Therefore, for example, the term "first" can be replaced with the term "second", "third", or the like as appropriate.

(Embodiment 1)

In this embodiment, a structure of a photoelectric conversion device which is one embodiment of the present invention is described with reference to FIG. 1, FIG. 2, FIG. 3, and FIGS. 4A to 4C.

A photoelectric conversion device described in this embodiment includes a first-conductivity-type crystalline semiconductor region provided over a conductive layer, a crystalline semiconductor region which is provided over the first-conductivity-type crystalline semiconductor region and has an uneven surface by including a plurality of whiskers including a crystalline semiconductor, and a second-conductivity-type crystalline semiconductor region provided to cover the uneven surface of the crystalline semiconductor region having the uneven surface. The second conductivity type is opposite to the first conductivity type.

FIG. 1 is a photoelectric conversion device including a substrate 101, an electrode 103, a first-conductivity-type crystalline semiconductor region 107, an intrinsic crystalline semiconductor region 109, a second-conductivity-type crystalline semiconductor region 111, and an insulating layer 113. The second conductivity type is opposite to the first conductivity type. The first-conductivity-type crystalline semiconductor region 107, the intrinsic crystalline semiconductor region 109, and the second-conductivity-type crystalline semiconductor region 111 function as a photoelectric conversion layer 106. The crystalline semiconductor region which has an uneven surface by including a plurality of whiskers including a crystalline semiconductor is formed in the intrinsic crystalline semiconductor region 109. The insulating layer 113 is formed over the second-conductivity-type crystalline semiconductor region 111.

In this embodiment, an interface between the electrode 103 and the first-conductivity-type crystalline semiconductor region 107 is flat. The intrinsic crystalline semiconductor region 109 includes a flat portion and a plurality of whiskers (a group of whiskers). In other words, the interface between the electrode 103 and the first-conductivity-type crystalline semiconductor region 107 is flat while a surface of the second-conductivity-type crystalline semiconductor region 111 is uneven. In addition, an interface between the intrinsic crystalline semiconductor region 109 and the second-conductivity-type crystalline semiconductor region 111 is uneven.

In this embodiment, a p-type crystalline semiconductor layer and an n-type crystalline semiconductor layer are used as the first-conductivity-type crystalline semiconductor region 107 and the second-conductivity-type crystalline semiconductor region 111, respectively; however, the p-type conductivity and the n-type conductivity may be interchanged with each other.

A crystalline silicon layer is used as the intrinsic crystalline semiconductor region 109. Note that in this specification, an "intrinsic semiconductor" refers to not only a so-called intrinsic semiconductor in which the Fermi level lies in the middle of the band gap, but also a semiconductor in which the concentration of an impurity imparting p-type or n-type conductivity is less than or equal to $1 \times 10^{20}$ cm$^{-3}$ and the photoconductivity is 100 times or more as high as the dark conductivity. This intrinsic semiconductor may include an impurity element belonging to Group 13 or Group 15 of the periodic table.

As the substrate 101, a glass substrate typified by an aluminosilicate glass substrate, a barium borosilicate glass substrate, and an aluminoborosilicate glass substrate, a sapphire substrate, a quartz substrate, or the like can be used. Alternatively, a substrate in which an insulating film is formed over a metal substrate such as a stainless steel substrate may be used. In this embodiment, a glass substrate is used as the substrate 101.

Note that the electrode 103 may include only the conductive layer 104. Alternatively, the electrode 103 may include the conductive layer 104 and a mixed layer 105 which is formed on a surface of the conductive layer. Further alternatively, the electrode 103 may include only the mixed layer 105.

The conductive layer 104 is formed using a metal element which forms silicide by reacting with silicon. Alternatively, the conductive layer 104 may have a stacked layer structure which includes a layer formed using a metal element having high conductivity typified by platinum, aluminum, copper, titanium, and an aluminum alloy to which an element which improves heat resistance, such as silicon, titanium, neodymium, scandium, or molybdenum, is added on the substrate 101 side; and a layer formed using a metal element which forms silicide by reacting with silicon on the first-conductivity-type crystalline semiconductor region 107 side. Examples of the metal element which forms silicide by reacting with silicon include zirconium, titanium, hafnium, vanadium, niobium, tantalum, chromium, molybdenum, cobalt, and nickel.

The mixed layer 105 may be formed using silicon and the metal element which is included in the conductive layer 104. Note that in the case where the mixed layer 105 is formed using silicon and the metal element included in the conductive layer 104, active species of a source gas are supplied to a portion being deposited depending on heat conditions in the formation of the first-conductivity-type crystalline semiconductor region 107 by an LPCVD method, and thus silicon is diffused into the conductive layer 104 to form the mixed layer 105.

In the case where the conductive layer 104 is formed using a metal element which forms silicide by reacting with silicon, silicide including the metal element is formed in the mixed layer 105. The silicide is typically one or more of zirconium silicide, titanium silicide, hafnium silicide, vanadium silicide, niobium silicide, tantalum silicide, chromium silicide, molybdenum silicide, cobalt silicide, and nickel silicide. Alternatively, an alloy layer of silicon and a metal element which forms silicide is formed.

In the case where the mixed layer 105 is provided between the conductive layer 104 and the first-conductivity-type crystalline semiconductor region 107, resistance at an interface between the conductive layer 104 and the first-conductivity-type crystalline semiconductor region 107 can be further reduced; therefore, series resistance can be further reduced as compared to the case where the first-conductivity-type crystalline semiconductor region 107 is directly stacked over the conductive layer 104. In addition, the adhesiveness between the conductive layer 104 and the first-conductivity-type crystalline semiconductor region 107 can be increased. As a result, yield of the photoelectric conversion device can be improved.

Note that the conductive layer 104 may have a foil shape, a plate shape, or a net shape. With such a shape, the conductive layer 104 can hold its shape by itself, and the substrate 101 is therefore not essential. For this reason, cost can be reduced. In addition, when the conductive layer 104 has a foil shape, a flexible photoelectric conversion device can be manufactured.

The first-conductivity-type crystalline semiconductor region 107 is typically formed using a semiconductor to which an impurity element imparting the first conductivity type is added. Silicon is suitable for a semiconductor material, in terms of productivity, a price, or the like. When silicon is used as the semiconductor material, phosphorus or arsenic, which imparts n-type conductivity, or boron, which imparts p-type conductivity, is used as the impurity element imparting the first conductivity type. Here, the first-conductivity-type crystalline semiconductor region 107 is formed using a p-type crystalline semiconductor.

Note that although the first conductivity type is p-type in this embodiment, the first conductivity type may be n-type.

The intrinsic crystalline semiconductor region 109 includes a crystalline semiconductor region 109a and a group of plural whiskers 109b including a crystalline semiconductor over the crystalline semiconductor region 109a. Note that the interface between the crystalline semiconductor region 109a and the whisker 109b is unclear. A plane that is in the same level as the bottom of the deepest valley of the valleys formed among whiskers 109b and is parallel to a surface of the electrode 103 is regarded as the interface between the crystalline semiconductor region 109a and the whisker 109b.

The crystalline semiconductor region 109a covers the first-conductivity-type crystalline semiconductor region 107. In addition, the whisker 109b is a whisker-like protrusion, and a plurality of the protrusions are dispersed. Note that the whisker 109b may have a column-like shape such as a cylinder or a prism, or a needle-like shape such as a cone or a pyramid. The top of the whisker 109b may be rounded. The diameter of the whisker 109b is greater than or equal to 100 nm and less than or equal to 10 µm, preferably greater than or equal to 500 nm and less than or equal to 3 µm. Further, the length along the axis of the whisker 109b is greater than or equal to 300 nm and less than or equal to 20 µm, preferably greater than or equal to 500 nm and less than or equal to 15 µm. The photoelectric conversion device in this embodiment includes one or more of the above whiskers.

Note that the length along the axis of the whisker 109b is the distance between the top (or the center of the top surface) of the whisker 109b and the crystalline semiconductor region 109a along the axis running through the top (or the center of the top surface) of the whisker 109b. The thickness of the intrinsic crystalline semiconductor region 109 is the sum of the thickness of the crystalline semiconductor region 109a and the length of a line running from the top of the whisker 109b perpendicularly to the crystalline semiconductor region 109a (i.e., the height of the whisker). The diameter of the whisker 109b refers to a length of a longer axis of a transverse cross-sectional shape at the interface between the crystalline semiconductor region 109a and the whisker 109b.

Note that the direction in which the whisker 109b extends from the crystalline semiconductor region 109a is referred to as a longitudinal direction. A cross-sectional shape along the longitudinal direction is referred to as a longitudinal cross-sectional shape. The shape of the plane normal to the longitudinal direction is referred to as a transverse cross-sectional shape.

In FIG. 1, the longitudinal directions of the whiskers 109b included in the intrinsic crystalline semiconductor region 109 extend in one direction, for example, the direction normal to the surface of the electrode 103. Note that the longitudinal direction of the whisker 109b may be substantially the same as the direction normal to the surface of the electrode 103. In that case, it is preferable that the difference between the angles of the two directions be typically within 5°.

Note that although the longitudinal directions of the whiskers 109b included in the intrinsic crystalline semiconductor region 109 extend in one direction, for example, the direction normal to the surface of the electrode 103 in FIG. 1, the longitudinal directions of the whiskers may be varied. Typically, the intrinsic crystalline semiconductor region 109 may include a whisker whose longitudinal direction is substantially the same as the direction normal to the surface of the electrode 103 and a whisker whose longitudinal direction is different from the direction normal to the surface of the electrode 103.

The second-conductivity-type crystalline semiconductor region 111 is formed using an n-type crystalline semiconductor. Note that semiconductor materials which can be used for the second-conductivity-type crystalline semiconductor region 111 are similar to those for the first-conductivity-type crystalline semiconductor region 107.

In this embodiment, an interface between the intrinsic crystalline semiconductor region 109 and the second-conductivity-type crystalline semiconductor region 111 and a surface of the second-conductivity-type crystalline semiconductor region 111 are uneven. Therefore, reflectance of light incident on the insulating layer 113 can be reduced. Further, the light incident on the photoelectric conversion layer 106 is efficiently absorbed by the photoelectric conversion layer 106 owing to a light-trapping effect; thus, the characteristics of the photoelectric conversion device can be improved.

Note that a concentration gradient of an impurity element imparting the first conductivity type is preferably formed from the first-conductivity-type crystalline semiconductor region 107 toward the crystalline semiconductor region 109, which are illustrated in FIG. 1. In other words, a concentration gradient of the impurity element is preferably formed between the crystalline semiconductor region 107 and the crystalline semiconductor region 109 (the region is also referred to as a contact portion). Note that since the interface between the crystalline semiconductor region 107 and the crystalline semiconductor region 109 is not clear, an embodiment of the present invention includes the case where the concentration gradient is in the crystalline semiconductor region 107, the case where the concentration gradient is in the crystalline semiconductor region 109, the case where the concentration gradient is in the both regions, and the case where the concentration gradient is in another region.

Figures 6A, 6B:
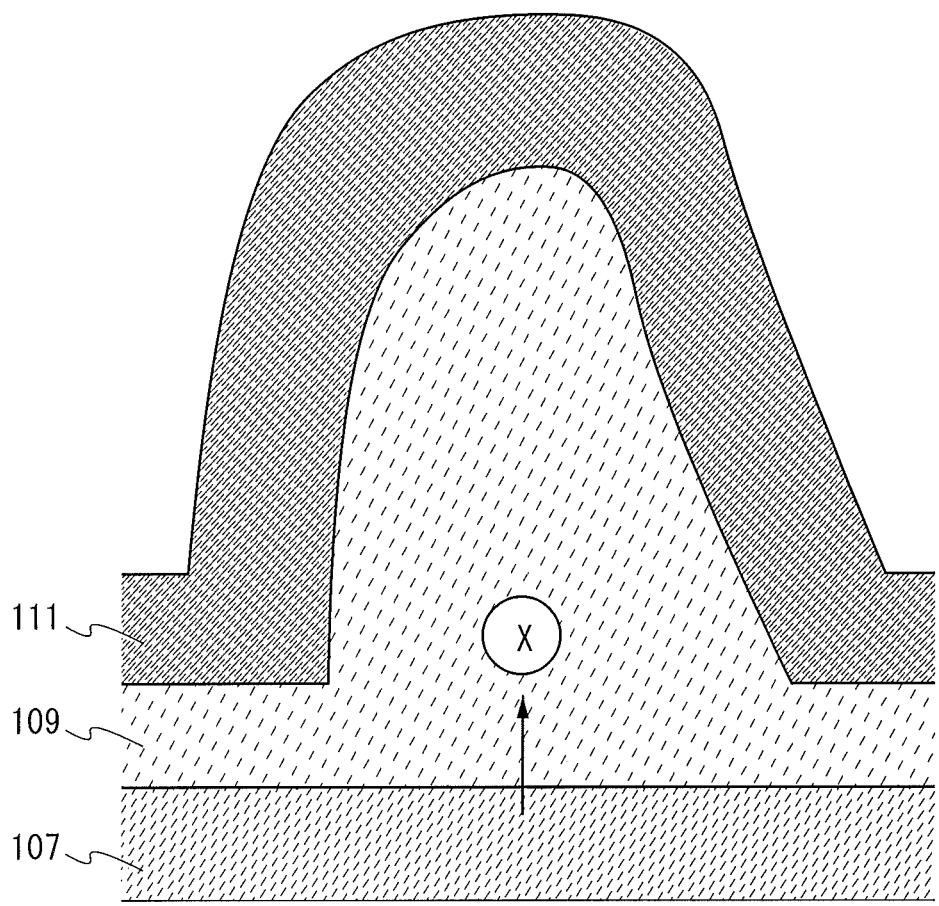
FIGS. 6A and 6B are cross-sectional views illustrating a photoelectric conversion device.

FIG. 6A is an enlarged view of a whisker in FIG. 1. As in FIG. 6A, part of the impurity element (X) imparting the first conductivity type included in the crystalline semiconductor region 107 moves from the crystalline semiconductor region 107 toward the crystalline semiconductor region 109, whereby a concentration gradient illustrated in FIG. 6B is formed. In other words, the impurity element concentration in the crystalline semiconductor region 107 is higher than that in the crystalline semiconductor region 109.

By thus forming the concentration gradient of the impurity element from the crystalline semiconductor region 107 toward the crystalline semiconductor region 109, a decrease in short-circuit current in the photoelectric conversion device can be prevented. In other words, even if the lifetime of minor carriers is shortened because of defects in the crystalline semiconductor region including a group of whiskers, a short-circuit current can be prevented from decreasing.

Note that the concentration gradient of the impurity element is not limited to a continuous change of the concentration. For example, a region whose concentration is higher than that of the crystalline semiconductor region 109 and lower than that of the crystalline semiconductor region 107 may be provided between the crystalline semiconductor region 107 and the crystalline semiconductor region 109.

Figure 2:
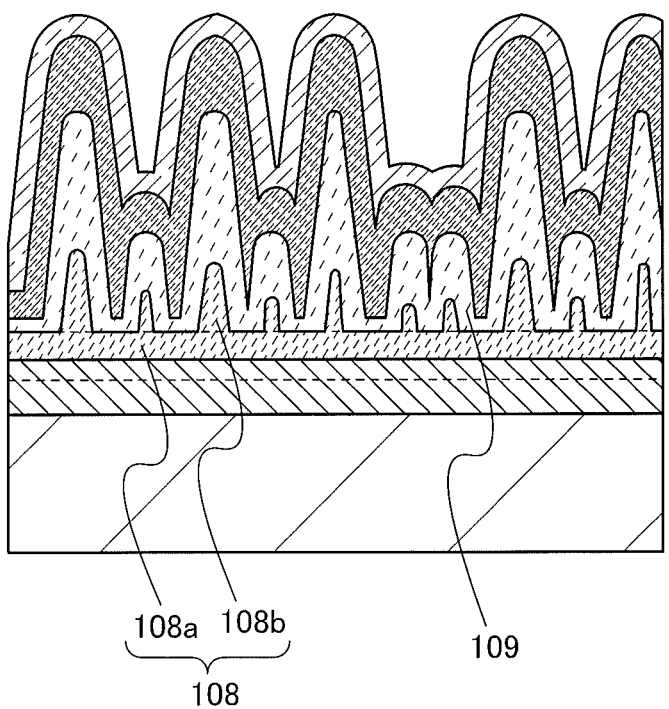
FIG. 2 is a cross-sectional view illustrating a photoelectric conversion device.

Note that an interface between a first-conductivity-type crystalline semiconductor region 108 and the intrinsic crystalline semiconductor region 109 may be uneven as illustrated in FIG. 2, whereas the interface between the first-conductivity-type crystalline semiconductor region 107 and the intrinsic crystalline semiconductor region 109 is flat in FIG. 1. The first-conductivity-type crystalline semiconductor region 108 illustrated in FIG. 2 includes a crystalline semiconductor region 108a including an impurity element imparting the first conductivity type and a group of plural whiskers 108b including a crystalline semiconductor including the impurity element imparting the first conductivity type over the crystalline semiconductor region 108a. Note that the interface between the crystalline semiconductor region 108a and the whisker 108b is unclear. A plane that is in the same level as the bottom of the deepest valley of the valleys formed among whiskers 108b and is parallel to a surface of the electrode 103 is regarded as the interface between the crystalline semiconductor region 108a and the whisker 108b.

The whisker 108b is a whisker-like protrusion, and a plurality of the protrusions are dispersed. Note that the whisker 108b may have a column-like shape such as a cylinder or a prism, or a needle-like shape such as a cone or a pyramid. The top of the whisker 108b may be rounded.

The longitudinal directions of the whiskers 108b included in the first-conductivity-type crystalline semiconductor region 108 extend in one direction, for example, the direction normal to the surface of the electrode 103. Note that the longitudinal direction of the whisker 108b may be substantially the same as the direction normal to the surface of the electrode 103. In that case, it is preferable that the difference between the angles of the two directions be typically within 5°.

Note that although the longitudinal directions of the whiskers 108b included in the first-conductivity-type crystalline semiconductor region 108 extend in one direction, for example, the direction normal to the surface of the electrode 103 in FIG. 2, the longitudinal directions of the whiskers may be varied. Typically, the first-conductivity-type crystalline semiconductor region 108 may include a whisker whose longitudinal direction is substantially the same as the direction normal to the surface of the electrode 103 and a whisker whose longitudinal direction is different from the direction normal to the surface of the electrode 103.

In the photoelectric conversion device illustrated in FIG. 2, the interface between the first-conductivity-type crystalline semiconductor region 108 and the intrinsic crystalline semiconductor region 109, the interface between the intrinsic crystalline semiconductor region 109 and the second-conductivity-type crystalline semiconductor region 111, and the surface of the second-conductivity-type crystalline semiconductor region 111 are uneven. Therefore, the reflectance of light incident on the insulating layer 113 can be reduced. In addition, light incident on the photoelectric conversion layer is efficiently absorbed by the photoelectric conversion layer owing to a light-trapping effect. Accordingly, the characteristics of the photoelectric conversion device can be improved.

Note that a concentration gradient of an impurity element imparting the first conductivity type is preferably formed from the first-conductivity-type crystalline semiconductor region 108 toward the crystalline semiconductor region 109, which are illustrated in FIG. 2. In other words, a concentration gradient of the impurity element is preferably formed between the crystalline semiconductor region 108 and the crystalline semiconductor region 109 (the region is also referred to as a contact portion). Note that since the interface between the crystalline semiconductor region 108 and the crystalline semiconductor region 109 is not clear, an embodiment of the present invention includes the case where the concentration gradient is in the crystalline semiconductor region 108, the case where the concentration gradient is in the crystalline semiconductor region 109, the case where the concentration gradient is in the both regions, and the case where the concentration gradient is in another region.

Figures 7A, 7B:
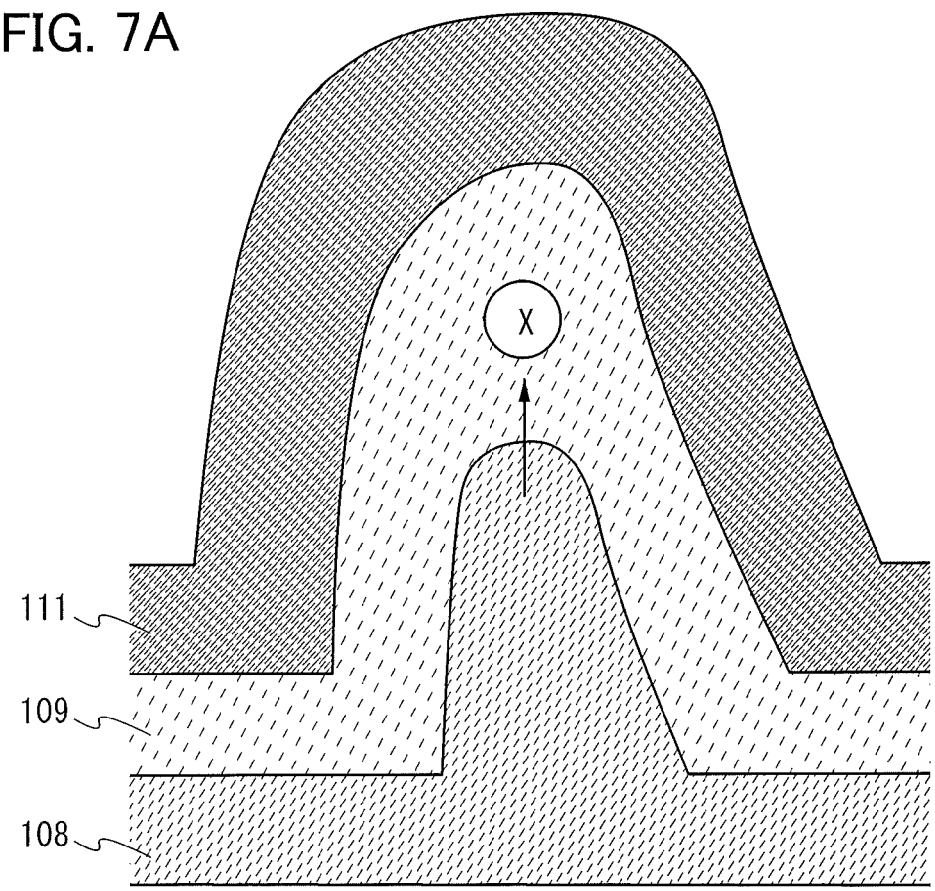
FIGS. 7A and 7B are cross-sectional views illustrating a photoelectric conversion device.

FIG. 7A is an enlarged view of a whisker in FIG. 2. As in FIG. 7A, part of the impurity element (X) imparting the first conductivity type included in the crystalline semiconductor region 108 moves from the crystalline semiconductor region 108 toward the crystalline semiconductor region 109, whereby a concentration gradient illustrated in FIG. 7B is formed. In other words, the impurity element concentration in the crystalline semiconductor region 108 is higher than that in the crystalline semiconductor region 109.

By thus forming the concentration gradient of the impurity element from the crystalline semiconductor region 108 toward the crystalline semiconductor region 109, a decrease in short-circuit current in the photoelectric conversion device can be prevented. In other words, even if the lifetime of minor carriers is shortened because of defects in the crystalline semiconductor region including a group of whiskers, a short-circuit current can be prevented from decreasing.

Note that the concentration gradient of the impurity element is not limited to a continuous change of the concentration. For example, a region whose concentration is higher than that of the crystalline semiconductor region 109 and lower than that of the crystalline semiconductor region 108 may be provided between the crystalline semiconductor region 108 and the crystalline semiconductor region 109.

Note that the insulating layer 113 which has an anti-reflection function is preferably formed over exposed surfaces of the electrode 103 and the second-conductivity-type crystalline semiconductor region 111.

For the insulating layer 113, a material whose refractive index is between the refractive indices of a light incident plane of the second-conductivity-type crystalline semiconductor region 111 and air is used. In addition, a material which transmits light with a predetermined wavelength is used so that incidence of light on the second-conductivity-type crystalline semiconductor region 111 is not interrupted. The use of such a material can prevent reflection at the light incidence plane of the second-conductivity-type crystalline semiconductor region 111. Note that as such a material, silicon nitride, silicon nitride oxide, or magnesium fluoride can be given, for example.

Figure 3:
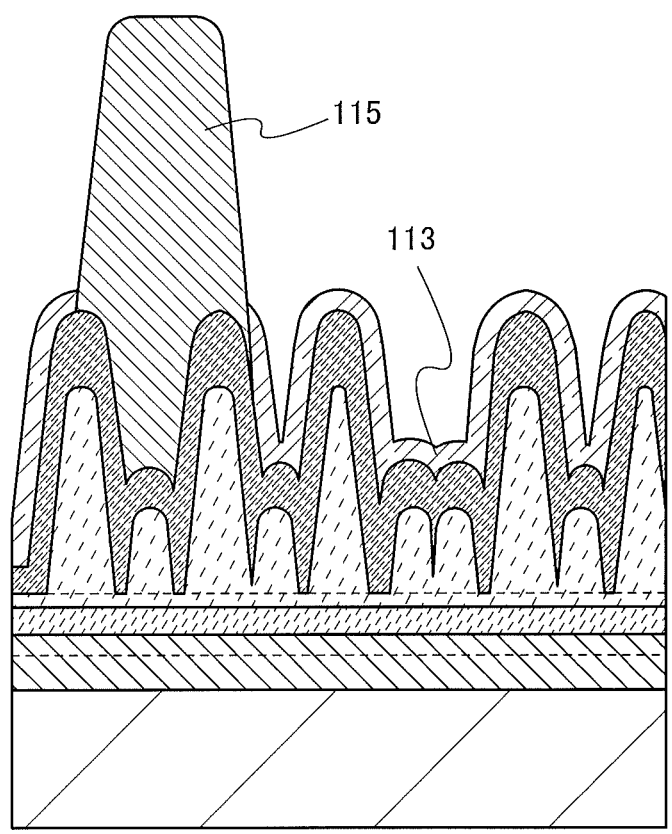
FIG. 3 is a cross-sectional view illustrating a photoelectric conversion device.

Note that as illustrated in FIG. 3, a grid electrode 115 for reducing the resistance of the second-conductivity-type crystalline semiconductor region 111 may be provided on the second-conductivity-type crystalline semiconductor region 111.

The grid electrode 115 is formed with a layer including a metal element such as silver, copper, aluminum, or palladium. By providing the grid electrode 115 to be in contact with the second-conductivity-type crystalline semiconductor region 111, resistance loss of the second-conductivity-type crystalline semiconductor region 111 can be reduced and electrical characteristics can be improved, in particular, under high illuminance.

Although not illustrated, an electrode may be provided over the second-conductivity-type crystalline semiconductor region 111. The electrode is formed using a light-transmitting conductive layer of an alloy of indium oxide and tin oxide (ITO), zinc oxide (ZnO), tin oxide ($SnO_2$), zinc oxide containing aluminum, or the like.

Next, a method for manufacturing the photoelectric conversion device illustrated in FIG. 1 will be described with reference to FIGS. 4A to 4C.

Figure 4A:
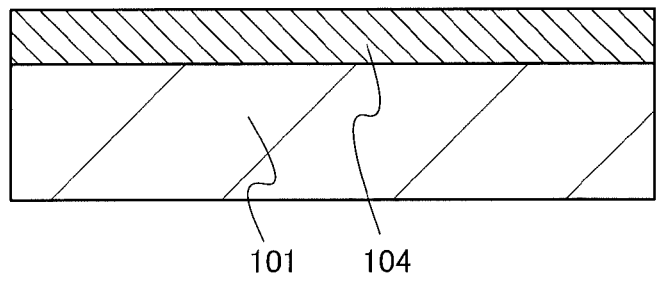
FIGS. 4A to 4C are cross-sectional views illustrating a method for manufacturing a photoelectric conversion device.

As in FIG. 4A, the conductive layer 104 is formed over the substrate 101. The conductive layer 104 can be formed by a printing method, a sol-gel method, a coating method, an ink-jet method, a CVD method, a sputtering method, an evaporation method, or the like, as appropriate. Note that in the case where the conductive layer 104 has a foil shape, it is not necessary to provide the substrate 101. Further, roll-to-roll processing can be employed.

Figure 4B:
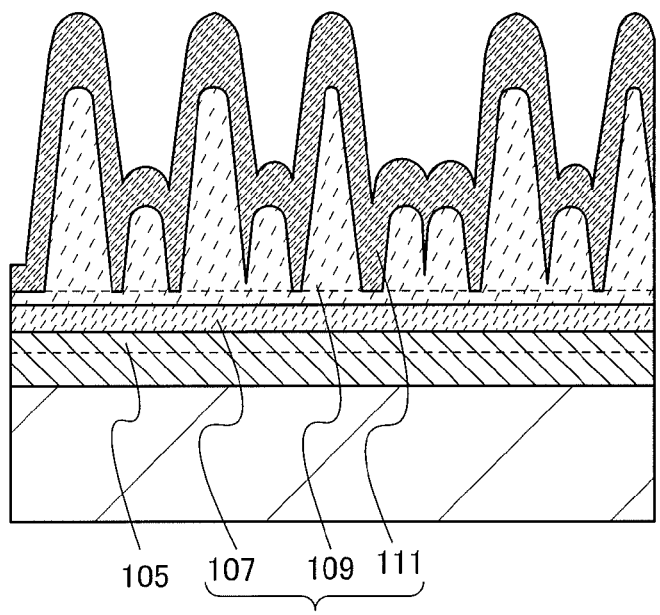

Next, as in FIG. 4B, the first-conductivity-type crystalline semiconductor region 107, the intrinsic crystalline semiconductor region 109, and the second-conductivity-type crystalline semiconductor region 111 are formed by an LPCVD method. The LPCVD method is performed as follows: heating is performed at a temperature higher than 550° C. and equal to or lower than the temperature at which an LPCVD apparatus and the conductive layer 104 can withstand, preferably higher than or equal to 580° C. and lower than 650° C.; at the same time, at least a deposition gas containing silicon is used as a source gas; and the pressure in a reaction chamber of the LPCVD apparatus is set to a pressure higher than or equal to a lower limit at which the pressure can be maintained while the source gas flows and lower than or equal to 200 Pa.

Examples of the deposition gas containing silicon include silicon hydride, silicon fluoride, and silicon chloride; typically, $SiH_4$, $Si_2H_6$, $SiF_4$, $SiCl_4$, $Si_2Cl_6$, and the like are given. Note that hydrogen may be introduced into the source gas.

When the first-conductivity-type crystalline semiconductor region 107 is formed by an LPCVD method, the mixed layer 105 may be formed between the conductive layer 104 and the first-conductivity-type crystalline semiconductor region 107 depending on heating conditions. In a step of forming the first-conductivity-type crystalline semiconductor region 107, active species of the source gas are constantly supplied to a portion being deposited, and silicon diffuses from the first-conductivity-type crystalline semiconductor region 107 to the conductive layer 104, whereby the mixed layer 105 is formed. For this reason, a low-density region (a sparse region) is not easily formed at an interface between the conductive layer 104 and the first-conductivity-type crystalline semiconductor region 107, and thus the characteristics of the interface between the conductive layer 104 and the first-conductivity-type crystalline semiconductor region 107 are improved, whereby series resistance can be reduced.

The first-conductivity-type crystalline semiconductor region 107 is formed by an LPCVD method in which diborane and a deposition gas containing silicon are introduced into a reaction chamber of an LPCVD apparatus as a source gas. The thickness of the first-conductivity-type crystalline semiconductor region 107 is greater than or equal to 5 nm and less than or equal to 500 nm. Here, a crystalline silicon layer to which boron is added is formed as the first-conductivity-type crystalline semiconductor region 107.

Then, the introduction of diborane into the reaction chamber of the LPCVD apparatus is stopped. Then, the intrinsic crystalline semiconductor region 109 is formed by an LPCVD method in which a deposition gas containing silicon is introduced as a source gas into the reaction chamber of the LPCVD apparatus. The thickness of the intrinsic crystalline semiconductor region 109 is greater than or equal to 500 nm and less than or equal to 20 μm. Here, a crystalline silicon layer is formed as the intrinsic crystalline semiconductor region 109. In this step, part of boron (X) included in the crystalline semiconductor region 107 moves from the crystalline semiconductor region 107 toward the crystalline semiconductor region 109 as in FIG. 6A, whereby a concentration gradient of boron is formed as in FIG. 6B.

Then, the second-conductivity-type crystalline semiconductor region 111 is formed by an LPCVD method in which phosphine or arsine and a deposition gas containing silicon are introduced as a source gas into the reaction chamber of the LPCVD apparatus. The thickness of the second-conductivity-type crystalline semiconductor region 111 is greater than or equal to 5 nm and less than or equal to 500 nm. Here, a crystalline silicon layer to which phosphorus or arsenic is added is formed as the second-conductivity-type crystalline semiconductor region 111.

Through the above steps, the photoelectric conversion layer 106 including the first-conductivity-type crystalline semiconductor region 107, the intrinsic crystalline semiconductor region 109, and the second-conductivity-type crystalline semiconductor region 111 can be formed.

Note that, in the manufacturing process of the photoelectric conversion device illustrated in FIG. 1, in the case where the introduction of diborane into the reaction chamber of the LPCVD apparatus is stopped before whiskers are formed in the first-conductivity-type crystalline semiconductor region 107, the interface between the first-conductivity-type crystalline semiconductor region 107 and the intrinsic crystalline semiconductor region is flat as in FIG. 1. On the other hand, in the case where the introduction of diborane into the reaction chamber of the LPCVD apparatus is stopped after whiskers are formed in the first-conductivity-type crystalline semiconductor region, the interface between the first-conductivity-type crystalline semiconductor region 108 and the intrinsic crystalline semiconductor region 109 is uneven as in FIG. 2. In the step of forming the intrinsic crystalline semiconductor region 109, part of boron (X) included in the crystalline semiconductor region 108 moves from the crystalline semiconductor region 108 toward the crystalline semiconductor region 109 as in FIG. 7A, whereby a concentration gradient of boron is formed as in FIG. 7B.

A surface of the conductive layer 104 may be cleaned with hydrofluoric acid before the formation of the first-conductivity-type crystalline semiconductor region 107. This step can enhance the adhesiveness between the electrode 103 and the first-conductivity-type crystalline semiconductor region 107.

Further, nitrogen or a rare gas such as helium, neon, argon, or xenon may be mixed into the source gas of the first-conductivity-type crystalline semiconductor region 107, intrinsic crystalline semiconductor region 109, and second-conductivity-type crystalline semiconductor region 111. In the case where nitrogen or a rare gas is added to the source gas of the first-conductivity-type crystalline semiconductor region 107, intrinsic crystalline semiconductor region 109, and second-conductivity-type crystalline semiconductor region 111, the density of whiskers can be increased.

After the formation of one or more of the first-conductivity-type crystalline semiconductor region 107, the intrinsic crystalline semiconductor region 109, and the second-conductivity-type crystalline semiconductor region 111, in the case where the introduction of the source gas into the reaction chamber of the LPCVD apparatus is stopped and the temperature is maintained in a vacuum state (i.e., vacuum heating is performed), the density of whiskers included in the first-conductivity-type crystalline semiconductor region 107 or the intrinsic crystalline semiconductor region 109 can be increased.

Figure 4C:
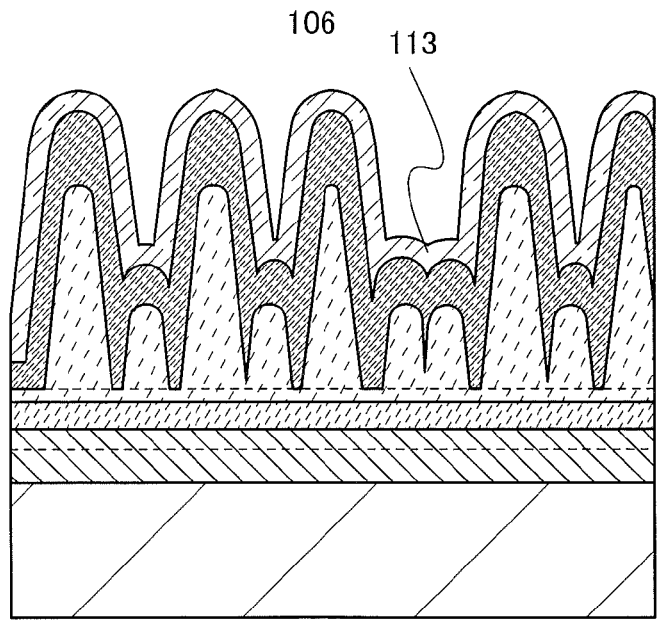

Then, as in FIG. 4C, the insulating layer 113 is formed over the second-conductivity-type crystalline semiconductor region 111. The insulating layer 113 can be formed by a CVD method, a sputtering method, an evaporation method, or the like.

With the above steps, a photoelectric conversion device with a high conversion efficiency can be manufactured even when the silicon substrate is not etched to form an electrode having an uneven structure (also referred to as a textured structure).

(Embodiment 2)

In this embodiment, a method for manufacturing a photoelectric conversion layer which has fewer defects than the photoelectric conversion layer in Embodiment 1 is described.

After one or more of the first-conductivity-type crystalline semiconductor region 107, the first-conductivity-type crystalline semiconductor region 108, the intrinsic crystalline semiconductor region 109, and the second-conductivity-type crystalline semiconductor region 111, which are described in Embodiment 1, are formed, the temperature of a reaction chamber in an LPCVD apparatus is set at a temperature higher than or equal to 400° C. and lower than or equal to 450° C., the introduction of a source gas into the LPCVD apparatus is stopped, and hydrogen is introduced. Then, in a hydrogen atmosphere, heat treatment at a temperature higher than or equal to 400° C. and lower than or equal to 450° C. is performed. In this manner, dangling bonds in one or more of the first-conductivity-type crystalline semiconductor region 107, the first-conductivity-type crystalline semiconductor region 108, the intrinsic crystalline semiconductor region 109, and the second-conductivity-type crystalline semiconductor region 111 can be terminated with hydrogen. The heat treatment is also referred to as a hydrogenation treatment. As a result of the heat treatment, defects in one or more of the first-conductivity-type crystalline semiconductor region 107, the first-conductivity-type crystalline semiconductor region 108, the intrinsic crystalline semiconductor region 109, and the second-conductivity-type crystalline semiconductor region 111 can be reduced, which leads to less recombination of photoexcited carriers in defects and also leads to an increase in conversion efficiency of the photoelectric conversion device.

Note that the hydrogenation treatment is preferably performed at least after the intrinsic crystalline semiconductor region 109 is formed. In that case, the conversion efficiency of the photoelectric conversion device can be increased while the throughput is increased.

(Embodiment 3)

In this embodiment, the structure of a so-called tandem photoelectric conversion device in which a plurality of photoelectric conversion layers are stacked is described with reference to FIG. 5. Although two photoelectric conversion layers are stacked in this embodiment, three or more photoelectric conversion layers may be stacked. In the following description, the photoelectric conversion layer which is closest to the light incident surface may be referred to as a top cell and the photoelectric conversion layer which is farthest from the light incident surface may be referred to as a bottom cell.

Figure 5:
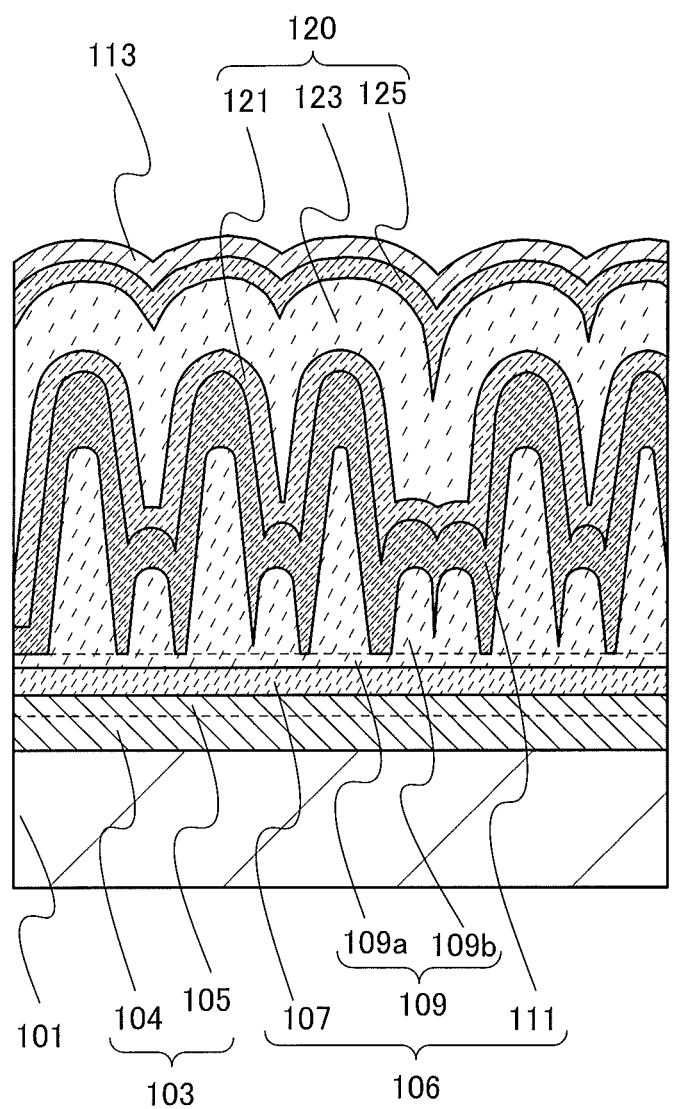
FIG. 5 is a cross-sectional view illustrating a photoelectric conversion device.

FIG. 5 illustrates a photoelectric conversion device in which the substrate 101, the electrode 103, the photoelectric conversion layer 106 which is the bottom cell, a photoelectric conversion layer 120 which is the top cell, and the insulating layer 113 are stacked. Here, the photoelectric conversion layer 106 includes the first-conductivity-type crystalline semiconductor region 107, the intrinsic crystalline semiconductor region 109, and the second-conductivity-type crystalline semiconductor region 111, which are described in Embodiment 1. The photoelectric conversion layer 120 includes a third-conductivity-type semiconductor region 121, an intrinsic semiconductor region 123, and a fourth-conductivity-type semiconductor region 125. The band gap of the intrinsic crystalline semiconductor region 109 in the photoelectric conversion layer 106 is preferably different from that of the intrinsic semiconductor region 123 in the photoelectric conversion layer 120. Use of semiconductors having different band gaps makes it possible to absorb a wide wavelength range of light; thus, a photoelectric conversion efficiency can be improved.

For example, a semiconductor with a large band gap can be used for the top cell while a semiconductor with a small band gap can be used for the bottom cell, and needless to say, vice versa. Here, as an example, a structure where a crystalline semiconductor (typically, crystalline silicon) is used in the photoelectric conversion layer 106, which is the bottom cell, and an amorphous semiconductor (typically, amorphous silicon) is used in the photoelectric conversion layer 120, which is the top cell, is described.

Note that although a structure where light is incident on the insulating layer 113 is described in this embodiment, one embodiment of the disclosed invention is not limited thereto. Light may be incident on the rear surface of the substrate 101 (the lower surface in the drawing).

The structures of the substrate 101, the electrode 103, the photoelectric conversion layer 106, and the insulating layer 113 are similar to those in the above embodiments and description thereof is omitted here.

In the photoelectric conversion layer 120, which is the top cell, a semiconductor layer including a semiconductor material to which an impurity element imparting a conductivity type is added is typically used as the third-conductivity-type semiconductor region 121 and the fourth-conductivity-type semiconductor region 125. Details of the semiconductor material and the like are similar to those of the first-conductivity-type crystalline semiconductor region 107 in Embodiment 1. In this embodiment, the case where silicon is used as the semiconductor material, the third conductivity type is p-type, and the fourth conductivity type is n-type is described. In addition, the crystallinity of the semiconductor layer is amorphous. It is needless to say that the third conductivity type may be n-type, the fourth conductivity type may be p-type, and the semiconductor layer is not necessarily amorphous.

For the intrinsic semiconductor region 123, silicon, silicon carbide, germanium, gallium arsenide, indium phosphide, zinc selenide, gallium nitride, silicon germanium, or the like is used. Alternatively, a semiconductor material including an organic material, a metal oxide semiconductor material, or the like can be used.

In this embodiment, amorphous silicon is used for the intrinsic semiconductor region 123. It is needless to say that the intrinsic semiconductor region 123 may be formed using a semiconductor material which is not silicon and has a band gap different from that of the intrinsic crystalline semiconductor region 109 in the bottom cell. Here, the thickness of the intrinsic semiconductor region 123 is preferably smaller than that of the intrinsic crystalline semiconductor region 109 and is typically greater than or equal to 50 nm and less than or equal to 1000 nm, preferably greater than or equal to 100 nm and less than or equal to 450 nm.

A plasma CVD method, an LPCVD method, or the like may be employed for forming the third-conductivity-type semiconductor region 121, the intrinsic semiconductor region 123, and the fourth-conductivity-type semiconductor region 125. In the case of a plasma CVD method, the intrinsic semiconductor region 123 can be formed in such a manner that the pressure in a reaction chamber of a plasma CVD apparatus is typically greater than or equal to 10 Pa and less than or equal to 1332 Pa, hydrogen and a deposition gas containing silicon are introduced as a source gas to the reaction chamber, and high-frequency electric power is supplied to an electrode to cause glow discharge. The third-conductivity-type semiconductor region 121 can be formed using the above source gas to which diborane is added. The third-conductivity-type semiconductor region 121 is formed with a thickness of greater than or equal to 1 nm and less than or equal to 100 nm, preferably greater than or equal to 5 nm and less than or equal to 50 nm. The fourth-conductivity-type semiconductor region 125 can be formed using the above source gas to which phosphine or arsine is added. The fourth-conductivity-type semiconductor region 125 is formed with a thickness of greater than or equal to 1 nm and less than or equal to 100 nm, preferably greater than or equal to 5 nm and less than or equal to 50 nm.

Alternatively, the third-conductivity-type semiconductor region 121 may be formed by forming an amorphous silicon layer by a plasma CVD method or an LPCVD method without adding an impurity element imparting a conductivity type and then adding boron by a method such as ion injection. The fourth-conductivity-type semiconductor region 125 may be formed by forming an amorphous silicon layer by a plasma CVD method or an LPCVD method without adding an impurity element imparting a conductivity type and then adding phosphorus or arsenic by a method such as ion injection.

As described above, by using amorphous silicon for the photoelectric conversion layer 120, light having a wavelength of less than 800 nm can be effectively absorbed and subjected to photoelectric conversion. Further, by using crystalline silicon for the photoelectric conversion layer 106, light having a longer wavelength (e.g., a wavelength up to approximately 1200 nm) can be absorbed and subjected to photoelectric conversion. Such a structure (a so-called tandem structure) in which photoelectric conversion layers having different band gaps are stacked can significantly increase a photoelectric conversion efficiency.

Note that although amorphous silicon having a large band gap is used in the top cell and crystalline silicon having a small band gap is used in the bottom cell in this embodiment, one embodiment of the disclosed invention is not limited thereto. The semiconductor materials having different band gaps can be used in appropriate combination to form the top cell and the bottom cell. The structure of the top cell and the structure of the bottom cell can be replaced with each other to form the photoelectric conversion device. Alternatively, a stacked layer structure in which three or more photoelectric conversion layers are stacked can be employed.

With the above structure, the conversion efficiency of a photoelectric conversion device can be increased.

(Embodiment 4)

In this embodiment, an example where a conductive layer is formed by a wet process over a second-conductivity-type crystalline semiconductor region in a photoelectric conversion device is described with reference to FIG. 8.

Figure 8:
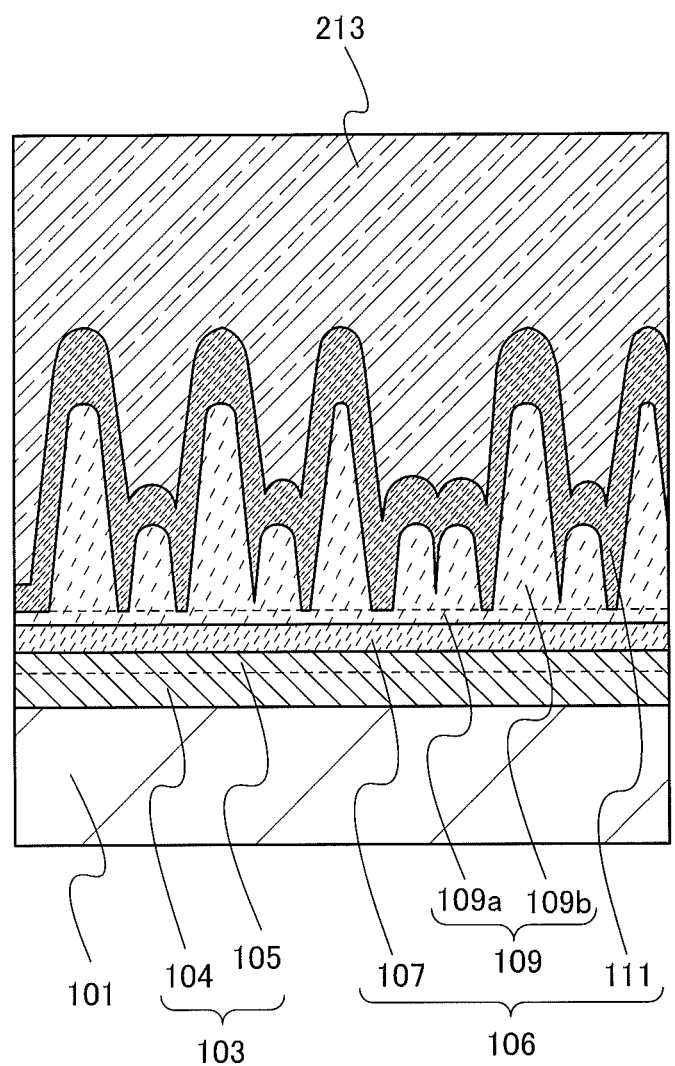
FIG. 8 is a cross-sectional view illustrating a photoelectric conversion device.

FIG. 8 is a photoelectric conversion device including the substrate 101, the first electrode 103, the first-conductivity-type crystalline semiconductor region 107, the intrinsic crystalline semiconductor region 109, the second-conductivity-type crystalline semiconductor region 111, and a conductive layer 213. The second conductivity type is opposite to the first conductivity type. The first-conductivity-type crystalline semiconductor region 107, the intrinsic crystalline semiconductor region 109, and the second-conductivity-type crystalline semiconductor region 111 function as the photoelectric conversion layer 106.

The first electrode 103 may include the conductive layer 104 and the mixed layer 105. In addition, an interface between the first electrode 103 and the first-conductivity-type crystalline semiconductor region 107 is flat. The intrinsic crystalline semiconductor region 109 includes a plurality of whiskers (a group of whiskers). Accordingly, the interface between the intrinsic crystalline semiconductor region 109 and the second-conductivity-type crystalline semiconductor region 111, and a surface of the second-conductivity-type crystalline semiconductor region 111 are uneven.

In this embodiment, the conductive layer 213 is formed by a wet process over part of or the whole of the second-conductivity-type crystalline semiconductor region 111. Thus, the conductive layer 213 can be formed with a good coverage over a surface of the second-conductivity-type crystalline semiconductor region 111 which has an uneven surface owing to the formation of whiskers. By forming the conductive layer 213 by a wet process over the surface of the second-conductivity-type crystalline semiconductor region 111 which has an uneven surface owing to the formation of whiskers, the resistance of the light incident surface can be reduced. Further, the conductive layer 213 may be used as an electrode. A material which is used for the conductive layer 213 is preferably a material which transmits light in a wavelength region which can be absorbed by a semiconductor region serving as the photoelectric conversion layer 106.

A wet process can be a coating method such as a dip coating method, a spin coating method, a spray coating method, an ink jetting method, or a printing method. Alternatively, an electrolytic plating method, an electroless plating method, or the like can be used.

A coating liquid used in a coating method may be a liquid or a liquid-like substance such as a sol or a gel which contains a conductive material. The conductive material may be a fine particle of a light-transmitting conductive metal oxide such as indium oxide-tin oxide alloy (ITO), zinc oxide (ZnO), tin oxide ($SnO_2$), or zinc oxide containing aluminum; a fine particle of a metal such as gold (Au), platinum (Pt), nickel (Ni), tungsten (W), chromium (Cr), molybdenum (Mo), iron (Fe), cobalt (Co), copper (Cu), palladium (Pd), or silver (Ag); or a conductive polymer such as conductive polyaniline, conductive polypyrrole, conductive polythiophene, polyethylenedioxythiophene (PEDOT), or polystyrene sulfonate (PSS). In the case where a fine particle is used as the conductive material, the surface of the fine particle may be coated with an organic substance or the like in order to improve dispersibility. A solvent (or a disperse medium) of the liquid which contains a conductive material can be water, alcohols, hydrocarbon-based compounds, ether compounds, or the like. These solvents (or disperse mediums) may be used alone or two or more of these solvents may be used in combination.

When a coating method is used as a wet process, a liquid or liquid-like substance which contains a conductive material is applied, dried, and baked, whereby the conductive layer 213 can be formed. When a coating method is used as a wet process, the thickness of the conductive layer 213 can be easily increased and thus the resistance of the conductive layer 213 can be reduced.

When the conductive layer 213 is thick, the surface of the conductive layer 213 becomes flat. In this case, the surface of the conductive layer 213 may be processed to be uneven so that reflectance of incident light may be reduced and that the characteristics of the photoelectric conversion device may be improved owing to a light-trapping effect.

Before the conductive layer 213 is formed, another conductive layer (not shown) may be formed over part of or the whole of the second-conductivity-type crystalline semiconductor region 111. For example, before the conductive layer 213 is formed, a conductive layer may be formed of a light-transmitting conductive material such as an indium oxide-tin oxide alloy (ITO), zinc oxide (ZnO), tin oxide ($SnO_2$), or zinc oxide containing aluminum by a dry process such as a CVD method, a sputtering method, or an evaporation method. By thus providing such a conductive layer in advance, the surface of the second-conductivity-type crystalline semiconductor region 111 can be protected. In addition, by thus providing such a conductive layer in advance, the adhesion between the conductive layer 213 and the second-conductivity-type crystalline semiconductor region 111 can be improved.

Alternatively, the conductive layer 213 may be a conductive liquid (a liquid containing an electrolyte) which is provided over the second-conductivity-type crystalline semiconductor region 111 to fill a space between whiskers and is used as an electrode. In this case, the conductive liquid can be introduced into a space between the substrate 101 and a second substrate which faces the substrate 101, and then sealed with a sealant to form the conductive layer 213. In any case, by providing an electrode to fill a space between whiskers, the resistance of the light incident surface can be reduced.

This embodiment can be combined with any of the other embodiments as appropriate.

EXAMPLE

In this example, difference in regular reflectance between a sample that is a titanium foil and a sample including a titanium foil and a group of whiskers formed of polysilicon on the titanium foil is described.

First, a method for forming the samples is described.

Sample 1

As the sample 1, a titanium foil with a thickness of 0.1 mm which was cut in a circle with a diameter φ of 12 mm was used.

Sample 2

A polysilicon layer including a group of whiskers was formed by an LPCVD method on a titanium foil with a shape similar to that of the sample 1, i.e. a thickness of 0.1 mm and a diameter φ of 12 mm. The polysilicon layer was formed by introducing silane for deposition for 2 hours and 15 minutes at a flow rate of 300 sccm into a process chamber in which the pressure was set to 13 Pa and the substrate temperature was set to 600° C.

Figure 9:
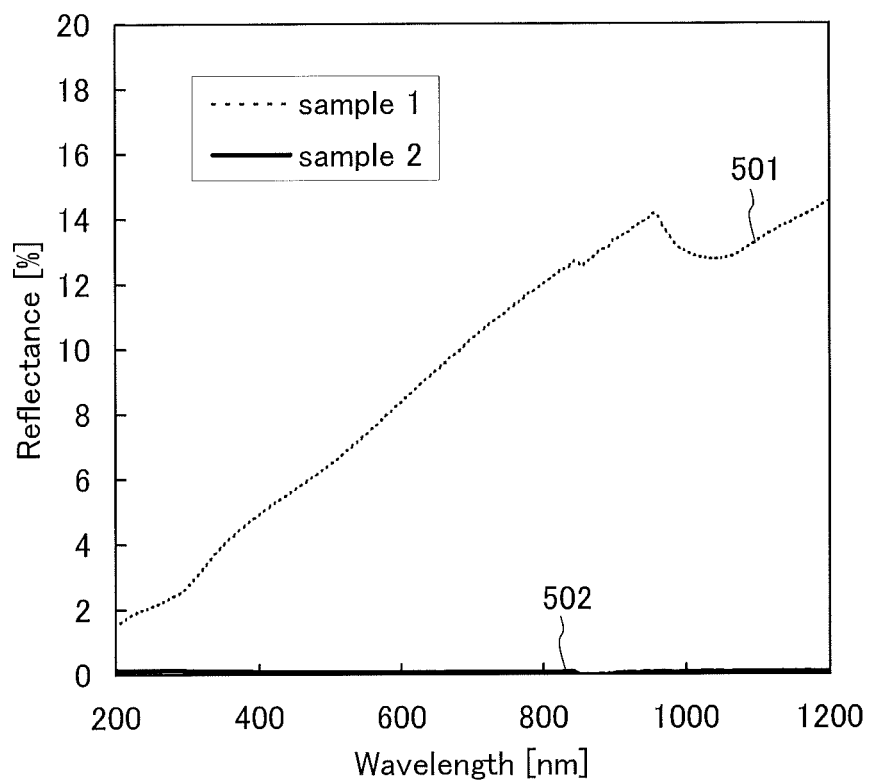
FIG. 9 is a graph showing light regular reflectance.

FIG. 9 illustrates the measurement results of the regular reflectance of the samples 1 and 2 with a spectrophotometer (U-4100 Spectrophotometer, manufactured by Hitachi High-Technologies Corporation). Here, the samples 1 and 2 were irradiated with light having wavelengths from 200 nm to 1200 nm with a sampling interval of 2 nm. An incident angle of the light incident on the samples was 5° and the reflectance of the light (i.e., 5-degree regular reflectance) was measured. The reflectance of the sample 1 is shown by a broken line 501 and the reflectance of the sample 2 is shown by a solid line 502. The horizontal axis represents the wavelength of the irradiation light and the vertical axis represents the reflectance of the irradiation light.

According to FIG. 9, the light reflectance of the sample 2 in which the polysilicon layer including the group of whiskers is formed on the surface of the titanium foil is extremely low, 0.14% at most, which means that there is almost no reflection of light. Note that since the signal-to-noise ratio (SN ratio) is small in a wavelength range of 850 nm to 894 nm, the reflectance is negative. In contrast, the sample 1 that is the titanium foil has a regular reflectance of 2% to 15%. The above results show that the reflectance can be reduced by forming the polysilicon layer including the group of whiskers on the surface of the titanium foil.

Explanation of Reference

101: substrate, 103: electrode, 104: conductive layer, 105: mixed layer, 106: photoelectric conversion layer, 107: crystalline semiconductor region, 108: crystalline semiconductor region, 108a: crystalline semiconductor region, 108b: whisker, 109: crystalline semiconductor region, 109a: crystalline semiconductor region, 109b: whisker, 111: crystalline semiconductor region, 113: insulating layer, 115: grid electrode, 120: photoelectric conversion layer, 121: semiconductor region, 123: semiconductor region, 125: semiconductor region, 213: conductive layer, 501: broken line, 502: solid line.

This application is based on Japanese Patent Application serial no. 2010-139993 filed with Japan Patent Office on Jun. 18, 2010, the entire contents of which are hereby incorporated by reference.

The invention claimed is:

1. A method for manufacturing a photoelectric conversion device, comprising the steps of:
   forming a first crystalline semiconductor region by a first low pressure chemical vapor deposition method using a deposition gas containing silicon and a gas imparting a first conductivity type as a source gas over an electrode;
   forming a second crystalline semiconductor region that includes a plurality of whiskers including a crystalline semiconductor by a second low pressure chemical vapor deposition method using a deposition gas containing silicon as a source gas over the first crystalline semiconductor region,
   moving an impurity element imparting the first conductivity type from the first crystalline semiconductor region toward the second crystalline semiconductor region during the formation of the second crystalline semiconductor region; and
   forming a third crystalline semiconductor region by a third low pressure chemical vapor deposition method using a deposition gas containing silicon and a gas imparting a second conductivity type as a source gas over the second crystalline semiconductor region.

2. The method for manufacturing a photoelectric conversion device according to claim 1, wherein the first low pressure chemical vapor deposition method, the second low pressure chemical vapor deposition method and the third low pressure chemical vapor deposition method are performed at a temperature higher than 550° C.

3. The method for manufacturing a photoelectric conversion device, according to claim 1, wherein silicon hydride, silicon fluoride, or silicon chloride is used for the deposition gas containing silicon.

4. The method for manufacturing a photoelectric conversion device, according to claim 1,
   wherein the first conductivity type is one of p-type and n-type, and
   wherein the second conductivity type is the other of the p-type and the n-type.

5. The method for manufacturing a photoelectric conversion device, according to claim 1,
   wherein the gas imparting the first conductivity type is one of diborane and phosphine, and
   wherein the gas imparting the second conductivity type is the other of the diborane and the phosphine.

6. A method for manufacturing a photoelectric conversion device, comprising the steps of:
   forming a first crystalline semiconductor region that includes a plurality of whiskers including a crystalline semiconductor by a first low pressure chemical vapor deposition method using a deposition gas containing silicon and a gas imparting a first conductivity type as a source gas over an electrode;
   forming a second crystalline semiconductor region by a second low pressure chemical vapor deposition method using a deposition gas containing silicon as a source gas over the first crystalline semiconductor region,
   moving an impurity element imparting the first conductivity type from the first crystalline semiconductor region toward the second crystalline semiconductor region during the formation of the second crystalline semiconductor region; and
   forming a third crystalline semiconductor region by a third low pressure chemical vapor deposition method using a deposition gas containing silicon and a gas imparting a second conductivity type as a source gas over the second crystalline semiconductor region.

7. The method for manufacturing a photoelectric conversion device according to claim 6, wherein the first low pressure chemical vapor deposition method, the second low pressure chemical vapor deposition method and the third low pressure chemical vapor deposition method are performed at a temperature higher than 550° C.

8. The method for manufacturing a photoelectric conversion device, according to claim 6, wherein silicon hydride, silicon fluoride, or silicon chloride is used for the deposition gas containing silicon.

9. The method for manufacturing a photoelectric conversion device, according to claim 6,
   wherein the first conductivity type is one of p-type and n-type, and
   wherein the second conductivity type is the other of the p-type and the n-type.

10. The method for manufacturing a photoelectric conversion device, according to claim 6,
   wherein the gas imparting the first conductivity type is one of diborane and phosphine, and
   wherein the gas imparting the second conductivity type is the other of the diborane and the phosphine.

* * * * *